(12) United States Patent
Chang et al.

(10) Patent No.: US 12,317,633 B2
(45) Date of Patent: May 27, 2025

(54) RADIATION HARDENED INFRARED FOCAL PLANE ARRAY

(71) Applicants: Yong Chang, Naperville, IL (US);
Silviu Velicu, Willowbrook, IL (US);
Sushant Sonde, Westmont, IL (US)

(72) Inventors: Yong Chang, Naperville, IL (US);
Silviu Velicu, Willowbrook, IL (US);
Sushant Sonde, Westmont, IL (US)

(73) Assignee: EPIR, INC., Bolingbrook, IL (US)

( * ) Notice: Subject to any disclaimer, the term of this patent is extended or adjusted under 35 U.S.C. 154(b) by 306 days.

(21) Appl. No.: 17/848,911

(22) Filed: Jun. 24, 2022

(65) Prior Publication Data

US 2023/0008594 A1     Jan. 12, 2023

Related U.S. Application Data

(60) Provisional application No. 63/214,556, filed on Jun. 24, 2021.

(51) Int. Cl.
| | |
|---|---|
| H01L 31/0352 | (2006.01) |
| H01L 23/00 | (2006.01) |
| H01L 31/02 | (2006.01) |
| H01L 31/0216 | (2014.01) |
| H01L 31/0224 | (2006.01) |
| H10F 77/00 | (2025.01) |
| H10F 77/14 | (2025.01) |
| H10F 77/20 | (2025.01) |
| H10F 77/30 | (2025.01) |

(52) U.S. Cl.
CPC ............. *H10F 77/14* (2025.01); *H01L 24/05* (2013.01); *H01L 24/13* (2013.01); *H10F 77/20* (2025.01); *H10F 77/30* (2025.01); *H10F 77/93* (2025.01); *H01L 2224/05548* (2013.01); *H01L 2224/13024* (2013.01); *H01L 2224/13109* (2013.01)

(58) Field of Classification Search
CPC .......................... H01L 27/14649; H01L 31/11
See application file for complete search history.

(56) References Cited

U.S. PATENT DOCUMENTS

| | | | | |
|---|---|---|---|---|
| 4,952,811 | A | * | 8/1990 | Elliott ....................... G01J 5/28 250/493.1 |
| 6,111,254 | A | * | 8/2000 | Eden ................... H01L 31/0224 257/E31.093 |
| 6,180,990 | B1 | * | 1/2001 | Claiborne ......... H01L 27/14621 257/E27.129 |

(Continued)

OTHER PUBLICATIONS

"Progress in focal plane array technologies" by Antoni Rogalski (Year: 2012).*

*Primary Examiner* — Evren Seven

(57) ABSTRACT

An FPA includes a substrate; a plurality of spaced-apart implant regions deposited in the substrate; a plurality of supplemental metal contacts, one supplemental metal contact of the plurality of supplemental metal contacts electrically connected to one implant region of the plurality of implant regions; a plurality of metal conductors electrically connecting the plurality of supplemental metal contacts; and a primary metal contact, electrically connected to the plurality of supplemental metal contacts by at least one of the metal conductors of the plurality of metal conductors. The pixel can include an Indium bump electrically connected to the primary metal contact.

5 Claims, 1 Drawing Sheet

(56) References Cited

U.S. PATENT DOCUMENTS

| | | | |
|---|---|---|---|
| 6,870,207 B2 * | 3/2005 | Taylor | H01L 27/14652 |
| | | | 257/183.1 |
| 11,528,442 B2 | 12/2022 | Pimpinella et al. | |
| 11,670,616 B2 | 6/2023 | Sonde et al. | |
| 2002/0148963 A1 * | 10/2002 | Claiborne | H01L 27/14625 |
| | | | 257/E31.038 |
| 2009/0045395 A1 * | 2/2009 | Kim | H01L 27/1464 |
| | | | 257/18 |
| 2010/0133418 A1 * | 6/2010 | Sargent | H10K 30/30 |
| | | | 977/773 |
| 2016/0035783 A1 * | 2/2016 | Dixon | H01L 31/1035 |
| | | | 257/184 |
| 2017/0221959 A1 * | 8/2017 | Udrea | H01L 31/09 |
| 2019/0288026 A1 * | 9/2019 | Von Kaenel | H01L 31/1844 |
| 2021/0091252 A1 * | 3/2021 | Atabaki | H01L 31/105 |
| 2021/0343762 A1 * | 11/2021 | King | H01L 27/14612 |
| 2022/0285298 A1 * | 9/2022 | Clarke | H01L 24/08 |
| 2022/0320168 A1 * | 10/2022 | Mahgerefteh | H01L 27/14685 |
| 2022/0367740 A1 * | 11/2022 | Clarke | H01L 27/1469 |
| 2022/0416095 A1 * | 12/2022 | Fulk | H01L 21/0217 |

\* cited by examiner

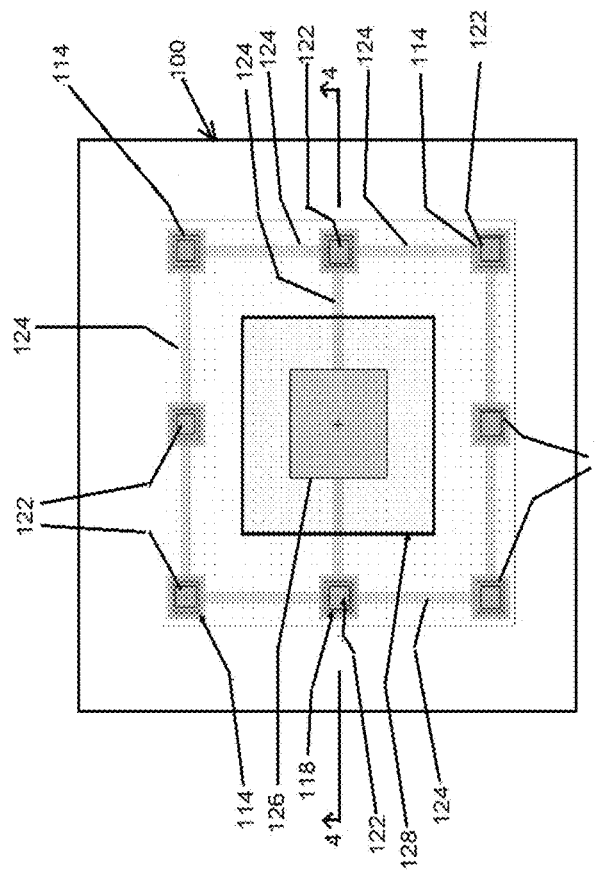
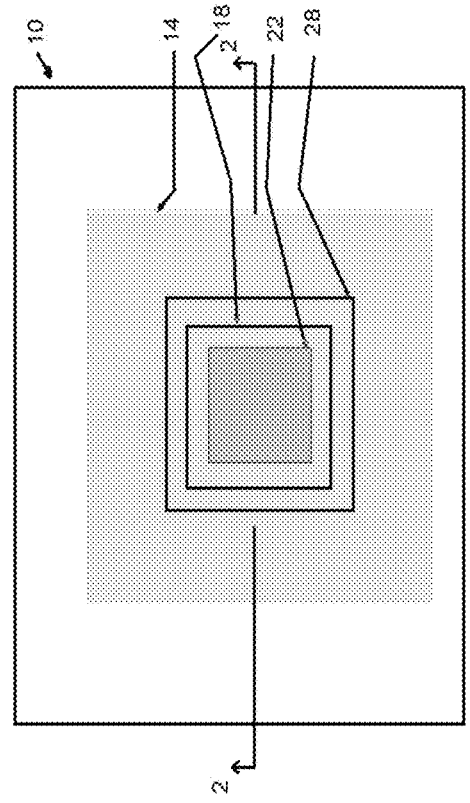
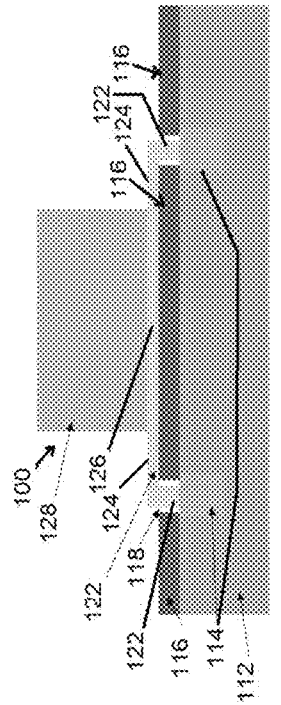
FIG. 3
FIG. 4
FIG. 1
PRIOR ART
FIG. 2
PRIOR ART

RADIATION HARDENED INFRARED FOCAL PLANE ARRAY

This application claims the benefit of Provisional Application U.S. Ser. No. 63/214,556 filed Jun. 24, 2021.

BACKGROUND

Conventional infrared focal plane arrays are prone to defects when exposed to radiation particles (proton, neutron and high energy photons). This degrades their performance.

FIGS. 1 and 2 illustrate an individual pixel 10 in a conventional planar focal plane array (FPA). FIG. 1 is shown transparently for clarity of the underlying layers. This pixel 10 includes a substrate 12, an implant region 14 formed into the substrate, a passivation layer 16 formed or deposited onto the substrate and the implant region, a passivation etch region 18 etched into the passivation layer 16 over the implant region, a metal contact 22 formed or deposited in the etched region, and an Indium bump 28 formed in the etched region and over the metal contact, electrically connected to the metal contact.

The implant region 14, the passivation etch region 18, the metal contact 22 and the Indium bump 28 are concentrically arranged. The present inventors have recognized that this arrangement i) is prone to defects when exposed to radiation particles, and ii) can cause potential defect formation in the device active region, the implant region 14, when hybridized by flip-chip bonding.

The present inventors have recognized that it would be desirable to provide a pixel arrangement that minimized adverse effects on the pixel due to exposure to radiation particles.

SUMMARY

An exemplary pixel for an FPA includes a substrate; a plurality of spaced-apart implant regions deposited in the substrate; a plurality of supplemental metal contacts, one supplemental metal contact of the plurality of supplemental metal contacts electrically connected to one implant region of the plurality of implant regions; a plurality of metal conductors electrically connecting the plurality of supplemental metal contacts; and a primary metal contact, electrically connected to the plurality of supplemental metal contacts by at least one of the metal conductors of the plurality of metal conductors.

The pixel can include an Indium bump electrically connected to the primary metal contact. The pixel can include a passivation layer over the substrate and etched-in passivation etch regions over the implant regions, the supplemental metal contacts being formed or deposited within the passivation etch regions.

Another aspect of the invention includes an individual pixel for an FPA that includes
  a substrate;
  a plurality of spaced-apart implant regions deposited in the substrate;
  a plurality of metal contacts, one metal contact of the plurality of metal contacts electrically connected to one implant region of the plurality of implant regions;
  a plurality of metal conductors, one metal conductor of the plurality of metal conductors electrically connected to two metal contacts of the plurality of metal contacts;
  a central metal contact, electrically connected to the plurality of metal contacts by at least one of the metal conductors of the plurality of metal conductors; and
  an Indium bump electrically connected to the central metal contact.

Before the metal contacts are formed or deposited, a passivation layer can be formed over the substrate and implant regions and then etched away at the implant regions. The metal contacts can be deposited or formed in the passivation etch regions. The metal conductors can be formed or deposited over the passivation layer. The metal conductors can be formed in a grid network to electrically connect the metal contacts and the central contact.

The exemplary embodiment pixel of the present invention is configured to be "radiation hard", i.e., resistant to adverse effects due to exposure to radiation particles. The embodiment includes distributed pixel active regions, thus making individual pixel statistically less prone to radiation defects, making them radiation hard. Additional advantage of the embodiment is that the Indium bump is not concentric to the device active region. This eliminates potential defect formation in the device active region when hybridized by flip-chip bonding.

Numerous other advantages and features of the present invention will become readily apparent from the following detailed description of the invention and the embodiments thereof, and from the accompanying drawings.

BRIEF DESCRIPTION OF THE DRAWINGS

FIG. 1 is a schematic, transparent plan view of a prior art pixel for an FPA;

FIG. 2 is a schematic, sectional view taken generally through plane 2-2 of FIG. 1;

FIG. 3 is a schematic transparent plan view of an embodiment of a pixel for an FPA of the present invention; and FIG. 4 is a schematic, sectional view taken generally through plane 4-4 of FIG. 3.

DETAILED DESCRIPTION

While various embodiments of the present invention have been described, it should be understood that other modifications and alternatives can be made without departing from the spirit and scope of the invention which should be determined from the appended claims. It is to be understood that no limitation with respect to the specific apparatus illustrated herein is intended or should be inferred.

This application incorporates by reference U.S. patent application Ser. No. 17/354,859, filed Jun. 22, 2021 and U.S. Ser. No. 63/214,556 filed Jun. 24, 2021.

A method of fabricating infrared detector arrays makes individual pixels "radiation hard." A modified pixel design, compared to FIGS. 1 and 2, is shown in FIGS. 3 and 4. The design distributes the pixel active region into multiple regions, thus making an individual pixel statistically less prone to radiation defects, making them "radiation hard."

An additional advantage of the design is that the Indium bump is not concentric to the device active region. This eliminates potential defect formation in the device active region when hybridized by flip-chip bonding.

FIGS. 3 and 4 illustrate one embodiment of the present invention. FIG. 3 is shown transparently for clarity of the underlying layers. An individual pixel 100 includes a substrate 112, spaced-apart implant regions 114 formed or deposited into the substrate, a passivation layer 116 formed on the substrate, passivation etch regions 118, one located over each implant region 114, spaced-apart or supplemental metal contacts 122 one located in each passivation etch region 118 and onto one implant region 114, metal conductors 124 electrically connecting the metal contacts 122 to a central or primary metal contact 126, and an Indium bump 128 formed over the central contact 126 and electrically connected thereto. Thus, the implant regions are distributed within the pixel and electrically connected to the Indium bump. Use of distributed device active regions results in a pixel that is radiation hard and multiple pixels makes for a radiation hard focal plane array (FPA).

The pixel can be hybridized to a readout integrated circuit (ROIC) by hybridizing by "flip chip bonding." Hybridizing by flip chip bonding is described for example in U.S. patent application Ser. No. 17/354,859, filed Jun. 22, 2021, particularly with regard to FIGS. 2(a)-2(e) and FIG. 2AA therein, the application herein incorporated by reference.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit this invention to the specific embodiments illustrated.

The invention claimed is:

1. A pixel for an FPA comprising:
   a substrate;
   a plurality of spaced-apart implant regions deposited in the substrate;
   a plurality of spaced-apart metal contacts, one spaced-apart metal contact of the plurality of spaced-apart metal contacts electrically connected to one implant region of the plurality of implant regions;
   a plurality of metal conductors, one metal conductor of the plurality of metal conductors electrically connected to two spaced-apart metal contacts of the plurality of spaced-apart metal contacts;
   a central metal contact, electrically connected to the plurality of spaced-apart metal contacts by at least one of the metal conductor of the plurality of metal conductors; and
   an Indium bump electrically connected to the central metal contact.

2. The pixel according to claim 1, further comprising a passivation layer over the substrate and etched in passivation etch regions over the implant regions, the metal contacts formed or deposited within the passivation etch regions.

3. A pixel for an FPA comprising:
   a substrate;
   a plurality of spaced-apart implant regions deposited in the substrate;
   a plurality of supplemental metal contacts, one supplemental metal contact of the plurality of supplemental metal contacts electrically connected to one implant region of the plurality of implant regions;
   a plurality of metal conductors electrically connecting the plurality of supplemental metal contacts; and
   a primary metal contact, electrically connected to the plurality of supplemental metal contacts by at least one of the metal conductors of the plurality of metal conductors.

4. The pixel according to claim 3, further comprising an Indium bump electrically connected to the primary metal contact.

5. The pixel according to claim 3, further comprising a passivation layer over the substrate and etched-in passivation etch regions over the implant regions, the supplemental metal contacts formed or deposited within the passivation etch regions.

* * * * *